(12) United States Patent
Marauska et al.

(10) Patent No.: US 11,280,855 B2
(45) Date of Patent: Mar. 22, 2022

(54) MAGNETIC FIELD SENSOR, SYSTEM, AND OBLIQUE INCIDENT DEPOSITION FABRICATION METHOD

(71) Applicant: NXP B.V., Eindhoven (NL)

(72) Inventors: Stephan Marauska, Kaltenkirchen (DE); Jörg Kock, Horst (DE)

(73) Assignee: NXP B.V., Eindhoven (NL)

( * ) Notice: Subject to any disclaimer, the term of this patent is extended or adjusted under 35 U.S.C. 154(b) by 372 days.

(21) Appl. No.: 16/524,590

(22) Filed: Jul. 29, 2019

(65) Prior Publication Data
US 2021/0033685 A1 Feb. 4, 2021

(51) Int. Cl.
*G01R 33/09* (2006.01)
*G01R 33/00* (2006.01)

(52) U.S. Cl.
CPC ....... *G01R 33/096* (2013.01); *G01R 33/0023* (2013.01); *G01R 33/091* (2013.01)

(58) Field of Classification Search
CPC ........................... G01R 33/096; G01R 33/0023
See application file for complete search history.

(56) References Cited

U.S. PATENT DOCUMENTS

| | | | |
|---|---|---|---|
| 6,818,961 B1 | 11/2004 | Rizzo et al. | |
| 8,043,483 B2 | 10/2011 | Endo et al. | |
| 9,123,877 B2* | 9/2015 | Lei | H01L 43/08 |
| 9,928,860 B2 | 3/2018 | Schlage et al. | |
| 10,591,320 B2* | 3/2020 | Marauska | G01R 33/096 |
| 2004/0046624 A1 | 3/2004 | Schmollngruber et al. | |
| 2017/0212189 A1* | 7/2017 | Holm | G01R 33/093 |

* cited by examiner

*Primary Examiner* — Reena Aurora

(57) ABSTRACT

A magnetic field sensor includes at least two magnetoresistive (MR) sensor elements arranged in a half-bridge configuration. Each of the MR sensor elements includes a magnetic region having a magnetic anisotropy with a resultant magnetization. The magnetic anisotropy is created using an oblique incident deposition (OID) technique, with the magnetic regions being deposited at a nonzero deposition angle relative to a reference line oriented perpendicular to a surface of the magnetic field sensor. A system includes an encoder and the half-bridge configuration of the sensor elements. The encoder produces an external magnetic field, having predetermined magnetic variations in response to motion of the encoder, the magnetic field being detectable by the sensor elements. The resultant magnetization of the sensor elements is aligned by OID in a preferred direction perpendicular to the direction of the external magnetic field instead of utilizing a permanent magnet structure for providing a bias magnetic field.

22 Claims, 8 Drawing Sheets

PRIOR ART

222

232

242

256

MAGNETIC FIELD SENSOR, SYSTEM, AND OBLIQUE INCIDENT DEPOSITION FABRICATION METHOD

TECHNICAL FIELD OF THE INVENTION

The present invention relates generally to magnetic field sensors. More specifically, the present invention relates to magnetic field sensors formed by oblique incident deposition.

BACKGROUND OF THE INVENTION

Magnetic field sensor systems are utilized in a variety of commercial, industrial, and automotive applications to measure magnetic fields for purposes of speed and direction sensing, rotation angle sensing, proximity sensing, and the like. Some magnetic field sensors are based upon the magnetoresistive effect in which a material has a tendency to change the value of its electrical resistance in response to an externally-applied magnetic field. Magnetoresistive devices include, for example, Anisotropic Magneto Resistance (AMR) technology, Giant Magneto Resistance (GMR) technology, Tunnel Magneto Resistance (TMR) technology, and so forth.

SUMMARY

Aspects of the disclosure are defined in the accompanying claims.

In a first aspect, there is provided a magnetic field sensor comprising a first magnetoresistive (MR) sensor element that includes a first magnetic region having a magnetic anisotropy with a resultant magnetization and a second MR sensor element that includes a second magnetic region having the magnetic anisotropy with the resultant magnetization, the first and second MR sensor elements being arranged in a half-bridge configuration. The magnetic anisotropy is created by depositing each of the first and second magnetic regions at a nonzero deposition angle relative to a reference line oriented perpendicular to a surface of the magnetic field sensor.

In a second aspect, there is provided a method of fabricating a magnetic field sensor comprising providing a substrate with a surface, forming a first magnetoresistive (MR) sensor element by depositing a first magnetic region having a magnetic anisotropy with a resultant magnetization on the surface of the substrate, forming a second MR sensor element by depositing a second magnetic region having the magnetic anisotropy with the resultant magnetization on the surface of the substrate, wherein the magnetic anisotropy is created by depositing the magnetic region at a nonzero deposition angle relative to a reference line oriented perpendicular to the surface of the substrate and the resultant magnetization of each of the first and second MR sensor elements is oriented in a first direction parallel to the surface of the substrate, and coupling the first and second MR sensor elements in a half-bridge configuration, the half-bridge configuration being configured to provide an output signal that is responsive to an external magnetic field oriented in a second direction parallel to the surface of the magnetic field sensor and oriented perpendicular to the first direction of the resultant magnetization.

In a third aspect, there is provided a system comprising an encoder configured to produce an external magnetic field having predetermined magnetic variations in response to motion of the encoder and a magnetic field sensor configured to detect the external magnetic field. The magnetic field sensor comprises a first magnetoresistive (MR) sensor element that includes a first magnetic region having a magnetic anisotropy with a resultant magnetization and a second MR sensor element that includes a second magnetic region having the magnetic anisotropy with the resultant magnetization, the first and second MR sensor elements being arranged in a half-bridge configuration. The magnetic anisotropy is created by depositing each of the first and second magnetic regions at a nonzero deposition angle relative to a reference line oriented perpendicular to a surface of the magnetic field sensor.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

In overview, the present disclosure concerns a magnetic field sensor, a system incorporating the magnetic field sensor, and methodology for fabricating the magnetic field sensor using an oblique incident deposition (OID) technique. More particularly, a magnetic field sensor includes magnetoresistive (MR) sensor elements, each having at least one magnetic region sputtered by oblique incident deposition. The OID technique yields a magnetic region having magnetic anisotropy and thus an easy axis. The resultant magnetization of the magnetic region aligns along the easy axis created by OID. The stable resultant magnetization of the MR sensor elements, created by the OID technique, may be implemented in lieu of utilizing a permanent magnet structure (e.g., a bias magnet) for providing a bias magnetic field to stabilize the magnetization of the magnetic regions of the MR sensor elements. Accordingly, a comparable magnetization configuration of the magnetic regions of the MR sensor elements may be achieved without the use of a permanent magnet structure (e.g., a bias magnet) for enhanced sensor performance and improvements in cost effectiveness. Multiples of the MR sensor elements may be coupled in one or more half-bridge configurations, which may be implemented in, for example, a rotational speed sensing system.

The instant disclosure is provided to further explain in an enabling fashion at least one embodiment in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming microfabrication techniques of depositing, patterning, etching, and so forth. Accordingly, although different shading and/or hatching is utilized in the illustrations, the different elements within the structural layers may be formed out of the same material.

Figure 1:
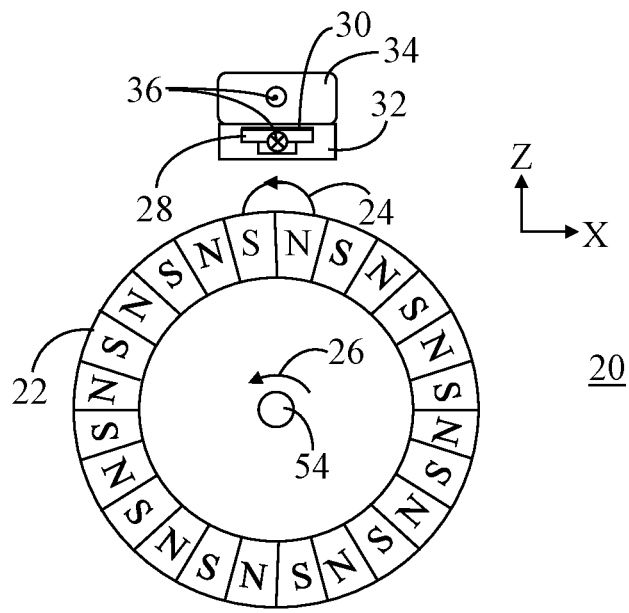
FIG. 1 shows a simplified diagram of a prior art system for rotational speed measurement.
Figure 2:
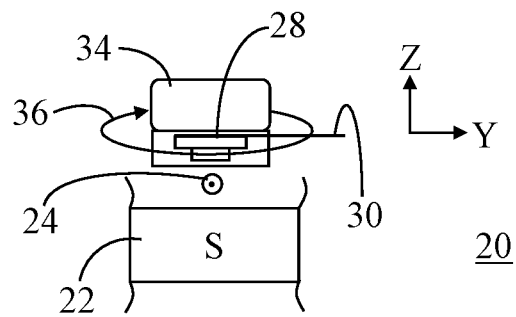
FIG. 2 shows a simplified diagram of a portion of the prior art system for rotational speed measurement.

Referring to FIGS. 1-2, FIG. 1 shows a simplified diagram of a prior art system 20 for rotational speed measurement and FIG. 2 shows a simplified diagram of a portion of system 20. In this example, system 20 includes an encoder 22 configured to produce an external magnetic field 24 having predetermined magnetic variations in response to rotation (denoted by a curved arrow 26 in FIG. 1) of encoder 22. The presented alternating north (N) and south (S) pole configuration shown in the example of FIG. 1 yields the predetermined magnetic variations.

System 20 further includes a sensor die 28 mounted to a distal end of a lead frame 30 and packaged within a plastic encapsulant 32. Sensor die 28 may include one or more magnetoresistive (MR) sensor elements (discussed in connection with FIG. 3) and functional circuitry for suitably processing output signals from the MR sensor elements. System 20 may further include a permanent magnet structure, referred to herein as a bias magnet 34, that is glued or otherwise attached to an outer surface of encapsulant 32. Bias magnet 34 provides a bias magnetic field 36 that is orthogonal to external magnetic field 24. Thus, in this example, bias magnetic field 36 is directed parallel to the Y-axis in a three-dimensional coordinate system and external magnetic field 24 is directed parallel to the X-axis in the three-dimensional coordinate system.

Figure 3:
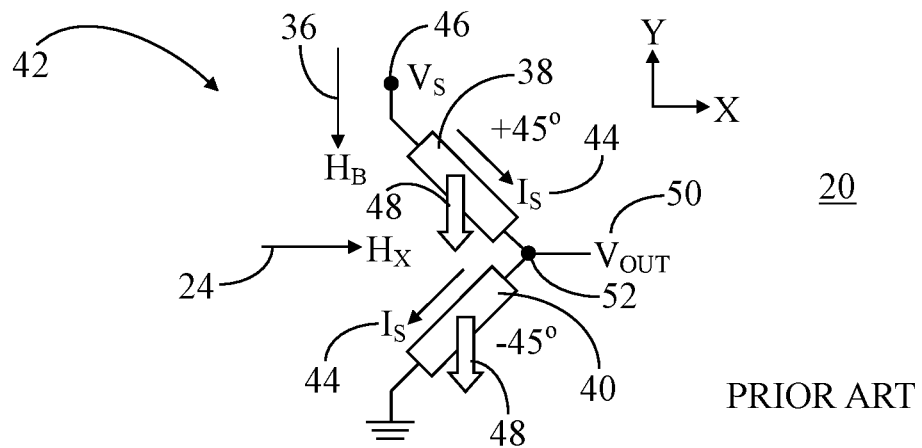
FIG. 3 shows a half-bridge configuration of magnetoresistive sensor elements of the prior art system.

Referring to FIG. 3 in connection with FIGS. 1 and 2, FIG. 3 shows a half-bridge configuration of magnetoresistive sensor elements of system 20. In this example, sensor die 28 includes first and second magnetoresistive (MR) sensor elements 38, 40 arranged in a half-bridge configuration 42. In half-bridge configuration 42, first and second MR sensor elements 38, 40 are connected in series and second MR sensor element 40 is nominally the same as first MR sensor element 38, with the exception that second MR sensor element 40 is arranged with an opposite polarity of sensitivity to external magnetic field 24 as compared with first MR sensor element 38. To linearize first and second MR sensor element 38, 40 for a speed sensing application, bias magnet 34 provides bias magnetic field 36, $H_B$, and first and second MR sensor elements 38, 40 are rotated ±45° relative to external magnetic field 24, $H_X$, and to bias magnetic field 36. Thus, a supply current 44, $I_S$, is injected at a voltage terminal 46, $V_S$, and flows 45° relative to a magnetization 48 (denoted by wide arrows) of first and second MR sensor elements 38, 40.

An output voltage 50, $V_{OUT}$, at a central node 52 between first and second MR sensor elements 38, 40 changes in response to external magnetic field 24. In half-bridge configuration 42, common mode changes in resistance (i.e., common to both of first and second MR sensor elements 38, 40) do not affect output voltage 50 at central node 52. In this example configuration, first and second MR sensor elements 38, 40 are configured to measure rotational speed of encoder 22, and hence to measure the rotational speed of an apparatus to which encoder 22 is attached. The apparatus is represented by a shaft 54 (FIG. 1) herein.

Physically, bias magnet 34 creates a unidirectional anisotropy axis (i.e., one easy axis) to which magnetization 48 of first and second MR sensor elements 38, 40 align to. Hence, first and second MR sensor elements 38, 40 are sometimes referred to as Anisotropic Magneto Resistance (AMR) sensor elements. Unfortunately, the requirement for bias magnet 34 leads to additional size and cost constraints incurred by the presence of bias magnet 34. Further, implementation of bias magnet 34 may negatively impact the performance of MR sensor elements 38, 40. For example, a temperature dependence effect, magnetic offset, and magnetic inhomogeneities of bias magnetic field 36 may limit the performance of the sensor. Embodiments described herein remove the need for bias magnet 34, thereby eliminating the associated cost, size, and sensor performance issues associated with the inclusion of bias magnet 34.

Figure 4:
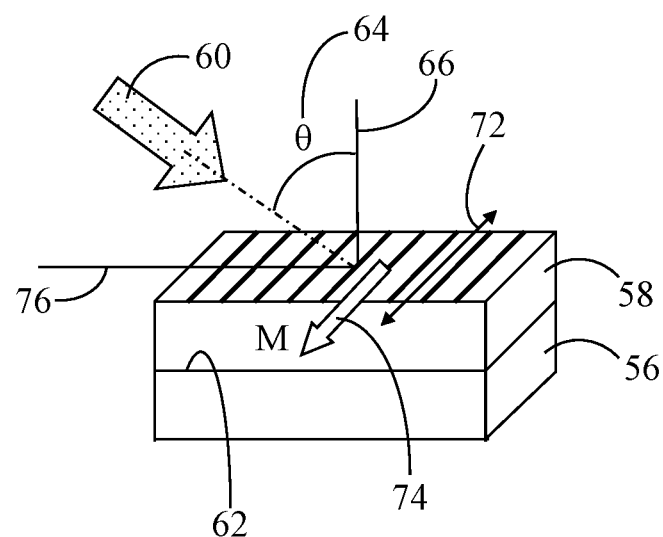
FIG. 4 shows perspective view of a substrate onto which a magnetic material layer is deposited by oblique incident deposition.
Figure 5:
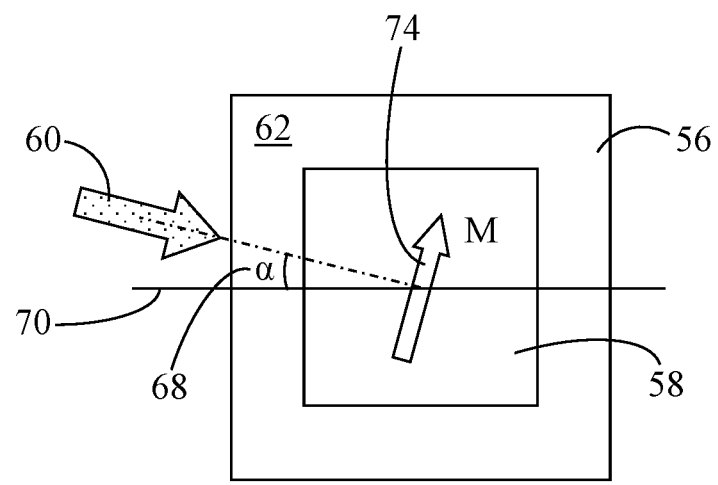
FIG. 5 shows a top view of the substrate of FIG. 4 onto which the magnetic material layer is deposited by oblique incident deposition.

Referring now to FIGS. 4-5, FIG. 4 shows perspective view of a substrate 56 onto which a magnetic material layer 58 is deposited by oblique incident deposition and FIG. 5 shows a top view of substrate 56 onto which magnetic material layer 58 is deposited by oblique incident deposition, alternatively referred to herein as OID. Magnetic material layer 58 may be formed by sputter deposition of nickel and iron atoms 60 (generally represented by a stippled arrow) to form a thin film of, for example, a few nanometers of Permalloy as magnetic material layer 58 on a surface 62 of substrate 56.

As shown in FIG. 4, nickel and iron atoms 60 are deposited at a nonzero deposition angle 64, θ, relative to a reference line 66 oriented perpendicular to surface 62 of substrate 56. In one example, deposition angle 64 may be 80°. As shown in FIG. 5, the deposition of nickel and iron atoms 60 may also be deposited at an azimuthal angle 68, α, with respect to a reference line 70. A nonzero azimuthal angle 68 is shown in FIG. 5 for illustrative purposes. However, azimuthal angle 68 may be 0° in some embodiments.

Due to the sputter deposition of nickel and iron atoms 60 at a large deposition angle 64 (e.g., 80°), the surface topography of magnetic material layer 58 undergoes a nano- or micro-structural modification that results in a waviness or surface corrugation of magnetic material layer 58. In FIG. 4, the waviness or surface corrugation is indicated by black stripes in magnetic material layer 58. Magnetically, this surface corrugation results in dipolar stray fields which are responsible for a uniaxial magnetic anisotropy. Thus, the deposited magnetic material layer 58 exhibits uniaxial magnetic anisotropy with a uniaxial (e.g., one) easy axis 72.

Magnetic anisotropy describes how an object's magnetic properties can be different depending on direction. For most magnetically anisotropic materials, there are two easiest directions to magnetize the material, which are a 180° rotation apart. Easy axis 72 denotes an energetically favorable direction of spontaneous magnetization and, therefore, corresponds to the two possible directions (180° apart) of a magnetization (sometimes referred to as the magnetic moment) of magnetic material layer 58. This uniaxial magnetic anisotropy and easy axis 72 are created parallel to surface 62 of substrate 56 and perpendicular to azimuth angle 68. As particularly shown in FIG. 4, a magnetization 74, M, of magnetic material layer 58 thus aligns along easy axis 72 created by OID. Depending upon the initial magnetic boundary conditions, magnetization 74 will align "up" or "down" (e.g., "down" in this example). A hard axis 76 may also be formed parallel to surface 62 of substrate 56 and perpendicular to easy axis 72. Hard axis 76 denotes an unfavorable direction of spontaneous magnetization.

Figure 6:
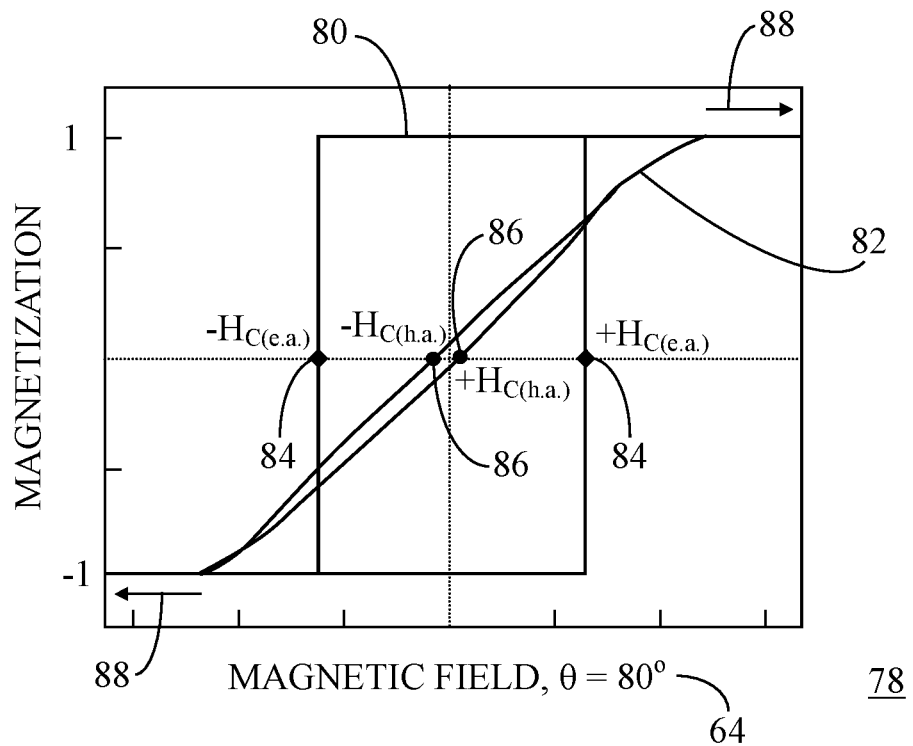
FIG. 6 shows a graph illustrating magnetization curves of the magnetic material layer of FIGS. 4-5 for the easy axis and the hard axis.

FIG. 6 shows a graph 78 illustrating magnetization curves of the magnetic material layer of FIGS. 4-5 for easy axis 72 (FIG. 4) and hard axis 76 (FIG. 4). In general, easy axis 72 is the direction along which a small applied magnetic field is sufficient to reach the saturation magnetization and hard axis 76 is the direction along which a large applied magnetic field is needed to reach the saturation magnetization. A first magnetization curve 80 for an OID deposition angle 64, θ (for example, 80°), represents the normalized magnetic response of a magnetic film along easy axis 72 and a second magnetization curve 82 represents the normalized magnetic response of the magnetic film along hard axis 76.

The uniaxial magnetic anisotropy due to the waviness or surface corrugation resulting from OID results in a clear creation of easy axis 72 and hard axis 76. First magnetization curve 80 for easy axis 72 shows a strong hysteresis and results in a flipping behavior of the magnetization when the external field reaches a coercivity field 84 ($\pm H_{C(e.a.)}$) of easy axis 72. Second magnetization curve 82 for hard axis 76 has a quasi linear response including minor hysteresis with a much smaller coercivity field 86 ($\pm H_{C(h.a.)}$) than coercivity field 84 for easy axis 72. Magnetization states are indicated by arrows 88 and indicate the direction with respect to the easy or hard axis. In general, a coercivity field is a measure of the ability of a ferromagnetic material to withstand an external magnetic field without becoming demagnetized. Both first and second magnetization curves 80, 82 for easy and hard axes 72, 76, respectively, show a saturation effect for high magnetic fields. Further, easy axis 80 leads to an alignment of the magnetization along this axis 80. Thus, OID creates a uniaxial (single axis) anisotropy along which magnetization 74 (FIG. 4) of magnetic material layer 58 (FIG. 4) aligns, comparable to a bias magnetic field created by a bias magnet.

Figure 7:
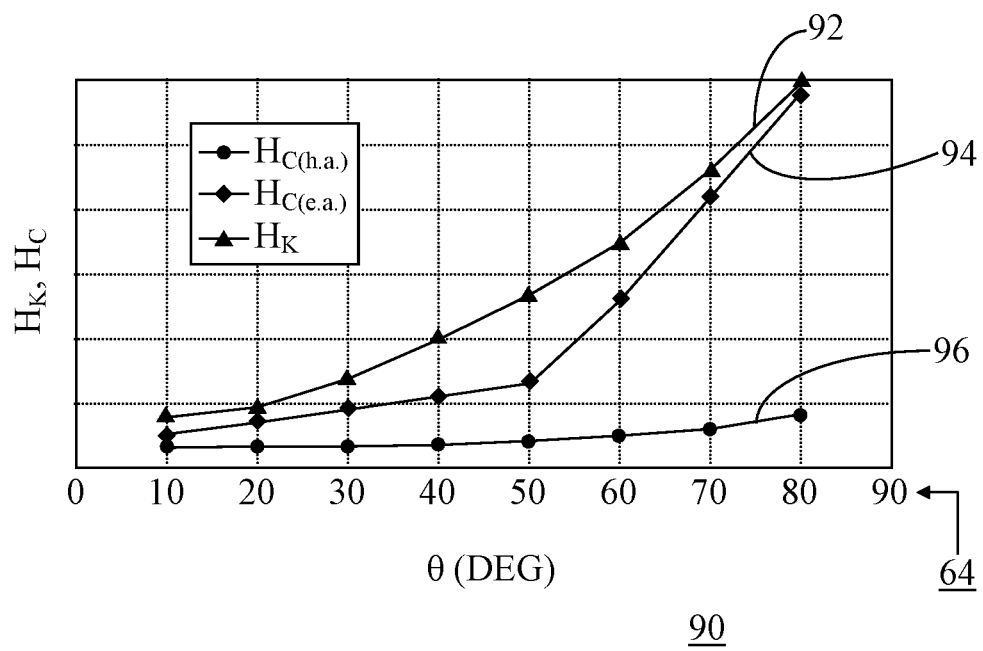
FIG. 7 shows a graph illustrating anistropy and coercivity field behavior versus a deposition angle for a magnetic material layer.

FIG. 7 shows a graph 90 illustrating anistropy and coercivity magnetic field behavior versus deposition angle 64 for a magnetic material layer (e.g., magnetic material layer 58, FIG. 4). In an example, a first curve 92 represents an anisotropy magnetic field, $H_K$, along easy axis 72, a second curve 94 represents a coercivity field, $H_{C(e.a.)}$, for easy axis 72, and a third curve 96, represents a coercivity field, $H_{C(h.a.)}$, for hard axis 76, all of which are in dependence of deposition angle 64 for a single magnetic layer. An exact behavior depends on the material system (e.g., Permalloy) and processing conditions (e.g., power). Second curve 94 reveals that the coercivity field, $H_{C(e.a.)}$, for easy axis 72 increases strongly for greater deposition angles 64) (θ>50°), while third curve 96 reveals that the coercivity field, $H_{C(h.a.)}$, for hard axis 76 increases only slightly and could in most cases be neglected. Indeed, the small coercivity field, $H_{C(h.a.)}$, for hard axis 76 may be necessary to realize low hysteresis.

First curve 92 reveals that the anisotropy magnetic field, $H_K$, also increases for greater deposition angles 64. Further, the anisotropy magnetic field, $H_K$, may be comparable to bias magnetic field 36, $H_B$ (FIG. 3), of bias magnet 34 (FIG. 3) produced in prior art systems (e.g., system 20). A larger anisotropy magnetic field, $H_K$, created by the OID topography waviness or surface corrugation may result in a higher measurement range, but may commensurately result in lower sensitivity (not shown) of an AMR layer. Nevertheless, the dependency on deposition angle 64 enables adjustment of the behavior of the film (e.g., magnetic material layer 58, FIG. 4) and sensor for the coercivity field, $H_{C(e.a.)}$, and anisotropy magnetic field, $H_K$, related to easy axis 72 and sensitivity (not shown) over a wide range. Thus, the oblique incident deposition technique enables adjustment with respect to application specific requirements by varying deposition angle 64.

Figure 8:
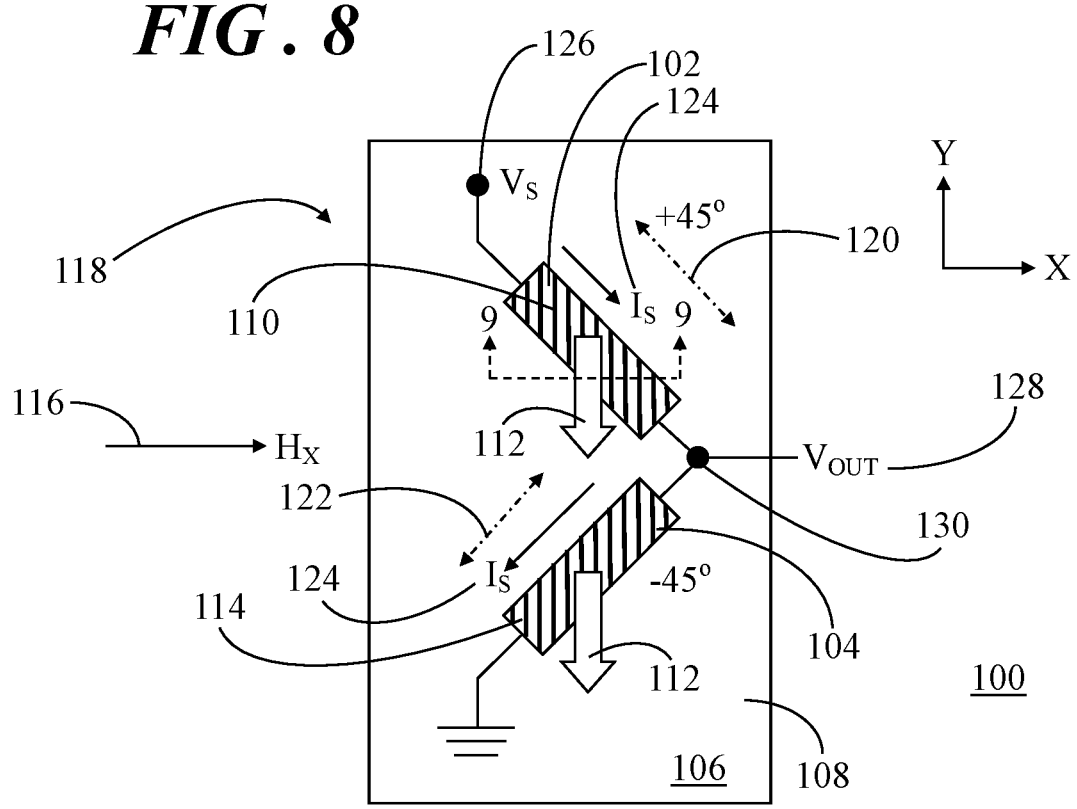
FIG. 8 shows a schematic view of a magnetic field sensor in accordance with an embodiment.
Figure 9:
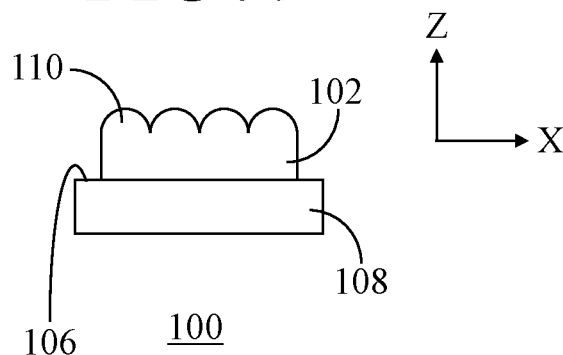
FIG. 9 shows a side view of an MR sensor element of the magnetic field sensor along section line 9-9 of FIG. 8.

Referring to FIGS. 8-9, FIG. 8 shows schematic view of a magnetic field sensor 100 in accordance with an embodiment and FIG. 9 shows a side view of a magnetoresistive sensor element along section line 9-9 of FIG. 8. Magnetic field sensor 100 includes a first magnetoresistive (MR) sensor element 102 and a second MR sensor element 104, each of which are formed on a surface 106 of a substrate 108. Substrate 108 may be a conventional inert wafer material. Alternatively, substrate 108 may be an application specific integrated circuit (ASIC) and first and second MR sensor elements 102, 104 may be fabricated on, or otherwise integrated with the ASIC. First MR sensor element 102 includes a first magnetic region 110 having a magnetic anisotropy with a resultant magnetization 112, M (denoted by a wide arrow). Second MR sensor element 104 includes a second magnetic region 114 having magnetic anisotropy with resultant magnetization 112, M (denoted by wide arrows).

In some embodiments, first and second sensor elements 102, 104 are arranged such that resultant magnetization 112 of first magnetic region 110 is oriented in the same direction as resultant magnetization 112 of second magnetic region 114. Further, resultant magnetization 112 of first and second magnetic regions 110, 114 is oriented in a first direction parallel to surface 106 of substrate 108 and parallel to a Y-axis in a three-dimensional coordinate system. Additionally, an external magnetic field 116 is oriented in a second direction that is also parallel to surface 106 of substrate 108 and is parallel to an X-axis in the three-dimensional coordinate system. Thus, external magnetic field 116 is perpendicular to resultant magnetization 112 of first and second magnetic regions 110, 114.

First and second MR sensor elements 102, 104 are arranged in a half-bridge configuration 118 in which first and second MR sensor elements 102, 104 are connected in series. Second MR sensor element 104 is nominally the same as first MR sensor element 102, with the exception that second MR sensor element 104 is arranged with an opposite polarity of sensitivity to external magnetic field 24 as compared with first MR sensor element 102. In some embodiments, first and second MR sensor elements 102, 104 may be configured as stripes with a length that is greater than a width. As such, first MR sensor element 102 has a first axis 120 parallel to its length and second MR sensor element 104 has a second axis 122 parallel to its length. First and second axes 120, 122 are parallel to surface 106 of substrate 108. However, first and second axes 120, 122 are offset from both of the first and second directions (e.g., offset from the Y- and X-axes of the three-dimensional coordinate system presented in FIG. 8).

In some embodiments, an angle between first and second axes 120, 122 may be substantially 90°. Thus, an offset angle between each of first and second axes 120, 122 and each of the first and second directions (e.g., the Y- and X-axes) may be 45°. As such, first and second MR sensor elements 102, 104 are rotated ±45° relative to external magnetic field 116, $H_X$. A supply current 124, $I_S$, is injected at a voltage terminal 126, $V_S$, and flows parallel to first and second axes 120, 122. Thus, supply current 124 flows 45° relative to resultant magnetization 112 of first and second MR sensor elements 102, 104 and 45° relative to external magnetic field 116. In alternative embodiments, the angular offset from the Y- and X-axes may differ from that shown.

An output voltage 128, $V_{OUT}$, at a central node 130 between first and second MR sensor elements 102, 104 changes in response to external magnetic field 116. The opposite orientation of first and second MR sensor elements 102, 104 relative to one another causes the AMR effect in first and second MR sensor elements 102, 104 to be opposite from one another. This causes the midpoint, e.g., central node 130, of half-bridge configuration 118 to show better and symmetric excitation since common mode changes in resistance (i.e., common to both of first and second MR sensor elements 102, 104) will not affect output voltage 128 at central node 130.

The magnetic anisotropy of first and second magnetic regions 110, 114 of first and second sensor elements 102, 104, respectively, is created by depositing each of first and second magnetic regions 110, 114 at a nonzero deposition angle 64 (FIG. 4) relative to reference line 66 (FIG. 4) oriented perpendicular to surface 106 of substrate 108. In other words, first and second MR sensor elements 102, 104 may be formed by an oblique incident deposition technique, as described in detail above in connection with FIGS. 4-5.

As demonstrated in the simplified illustration of FIG. 9, the surface topography of first and second magnetic regions 110, 114 undergoes a nano- or micro-structural modification that results in a waviness or surface corrugation of first and second magnetic regions 110, 114. In FIG. 8, the waviness or surface corrugation is indicated by black stripes in first and second magnetic regions 110, 114. Magnetically, this surface corrugation results in the uniaxial magnetic anisotropy with a uniaxial easy axis along which resultant magnetization 112 aligns.

Figure 10:
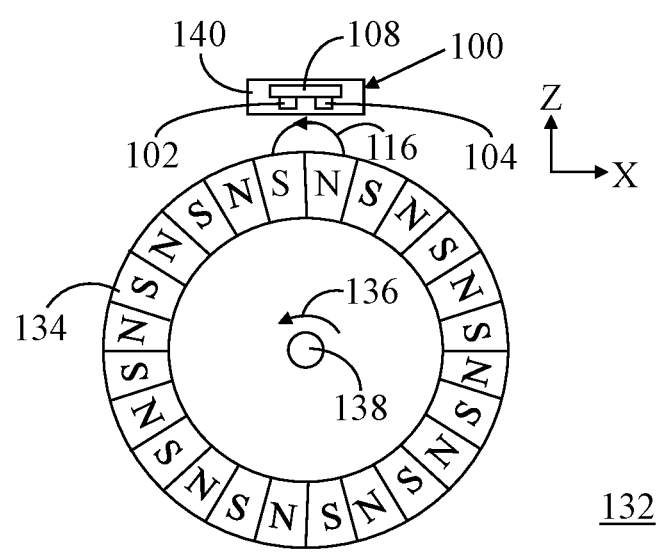
FIG. 10 shows a simplified diagram of a system for rotational speed measurement in accordance with another embodiment.

FIG. 10 shows a simplified diagram of a system 132 for rotational speed measurement in accordance with another embodiment. System 132 includes an encoder 134 configured to produce external magnetic field 116 having predetermined magnetic variations in response to rotation (denoted by a curved arrow 136) of encoder 134 and consequently of an apparatus (e.g., a shaft 138) with which encoder 134 is coupled. The presented alternating north (N) and south (S) pole configuration of encoder 134 yields the predetermined magnetic variations. Alternative embodiments may implement a ferromagnetic gear wheel or other similar structure. Other possible magnetizations are possible, such as tooth-to-tooth with alternating north and south poles.

System 132 further includes magnetic field sensor 100 configured to detect external magnetic field 116. Magnetic field sensor 100 may be configured as a sensor die mounted to a distal end of a lead frame (not shown) and packaged within a plastic encapsulant 140. Again, magnetic field sensor 100 includes first and second MR sensor elements 102, 104 formed on substrate 108 by an OID technique. Magnetic field sensor 100 may also include functional circuitry for suitably processing output signals from first and second MR sensor elements 102, 104. In this configuration, the signal processing capabilities of magnetic field sensor 100 may entail generating a speed pulse in response to output voltage 128 (FIG. 8). For example, a speed pulse may be generated whenever output voltage 128 crosses the zero level. The speed is indicative of a speed of an apparatus (e.g., shaft 138) to which encoder 134 is coupled. As such the rotational speed of shaft 138 may be derived by counting the speed pulses per second.

Accordingly, as discussed above in connection with FIGS. 8-9, resultant magnetization 112 of first and second magnetic regions 110, 114 is aligned in a preferred direction (in this configuration, parallel to the Y-axis and perpendicular to external magnetic field 116 parallel to the X-axis) in lieu of utilizing a permanent magnet structure (e.g., bias magnet 34 of system 20, FIGS. 1-2). Accordingly, a comparable magnetization configuration may be achieved utilizing first and second MR sensors 102, 104 having first and second magnetic regions 110, 114 formed by OID without the use of a permanent magnet structure (e.g., a bias magnet) for enhanced sensor performance and improvements in cost effectiveness, as well as system size reduction.

Figure 11:
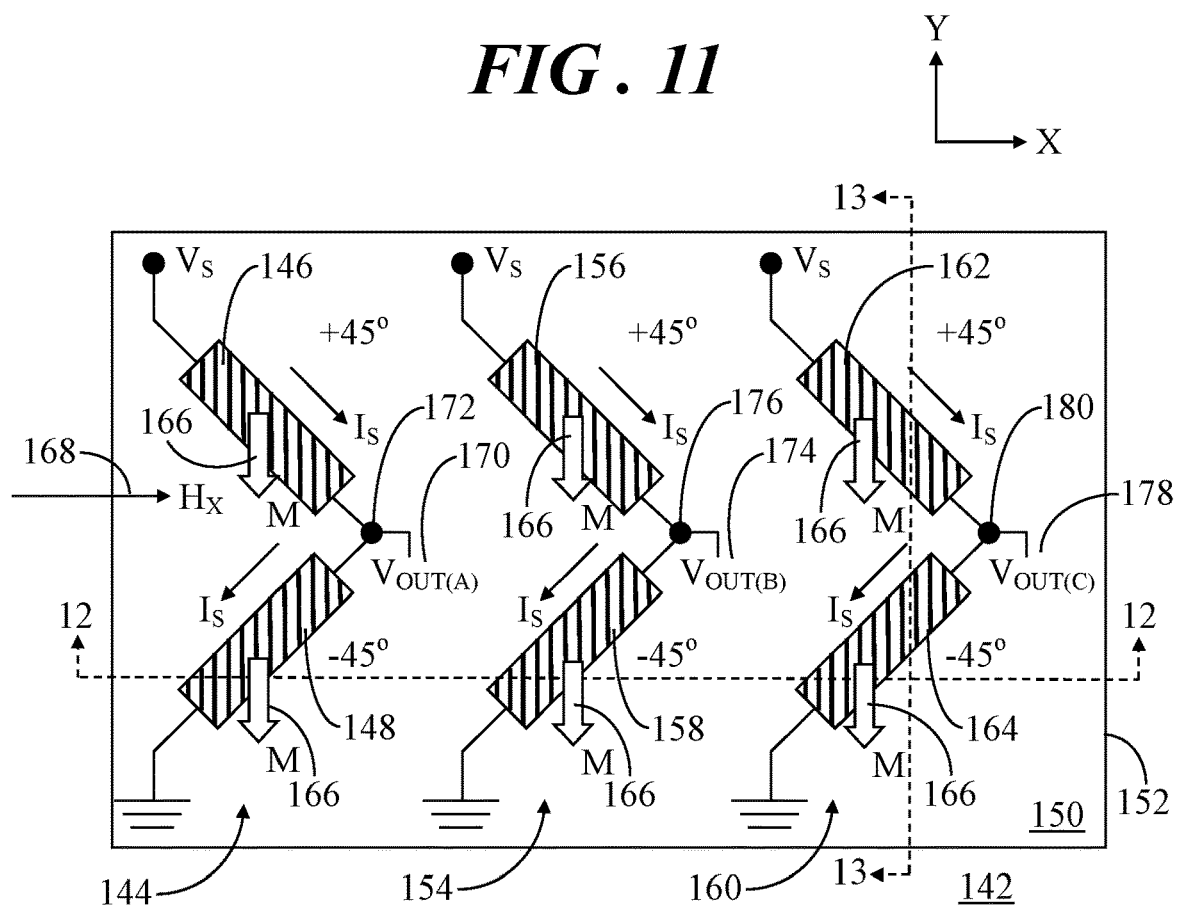
FIG. 11 shows a schematic diagram of a magnetic field sensor having multiple half-bridge configurations of MR sensor elements in a gradient configuration in accordance with another embodiment.
Figure 12:
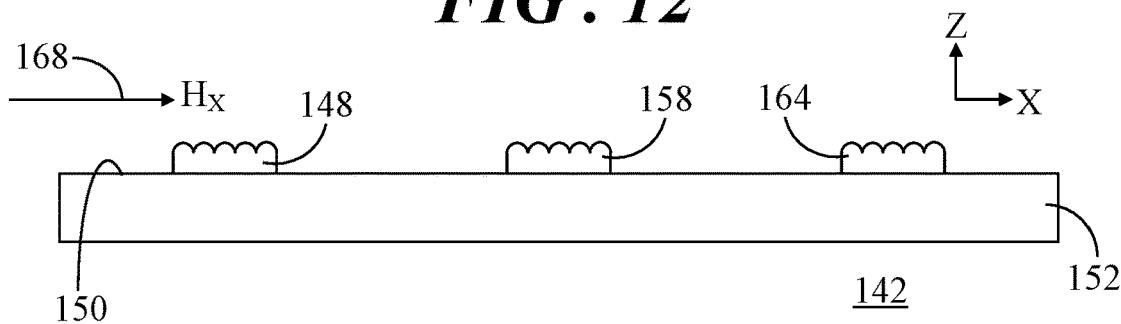
FIG. 12 shows a side view of the magnetic field sensor along section line 12-12 of FIG. 11.
Figure 13:
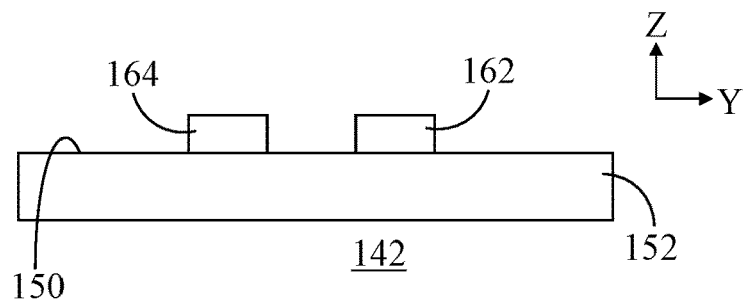
FIG. 13 shows a side view of the magnetic field sensor along section line 13-13 of FIG. 11.

Referring to FIGS. 11-13, FIG. 11 shows a schematic diagram of a magnetic field sensor 142 having multiple half-bridge configurations of MR sensor elements arranged in a gradient configuration in accordance with another embodiment, FIG. 12 shows a side view of the magnetic field sensor along section line 12-12 of FIG. 11, and FIG. 13 shows a side view of the magnetic field sensor along section line 13-13 of FIG. 11. In general, multiples of the MR sensor elements may be coupled in one or more half-bridge configurations, which may be implemented in a gradient configuration in, for example, a rotational speed sensing system (e.g., system 132 of FIG. 10).

As such, magnetic field sensor 142 includes a first half-bridge configuration 144 that includes a first MR sensor element 146 and a second MR sensor element 148 formed on a surface 150 of a substrate 152. Magnetic field sensor 142 further includes a second half-bridge configuration 154 that includes a third MR sensor element 156 and a fourth MR sensor element 158 formed on surface 150 of substrate 152. Additionally, magnetic field sensor 142 further includes a third half-bridge configuration 160 that includes a fifth MR sensor element 162 and a sixth MR sensor element 164 formed on surface 150 of substrate 152. Each of MR sensor elements 146, 148, 156, 158, 162, 164 includes magnetic regions having a magnetic anisotropy with a resultant magnetization 166, M (denoted by a wide arrow). Each of first, second, and third half-bridge configurations 144, 154, 160 are constructed as half-bridge configuration 118 (FIG. 8). Thus, the magnetic anisotropy of each of MR sensor elements 146, 148, 156, 158, 162, 164 is created by an OID technique in which their associated magnetic regions are deposited at the nonzero deposition angle 64, θ.

As demonstrated in the simplified illustration of FIG. 12, the surface topography of the magnetic regions of MR sensor elements 146, 148, 156, 158, 162, 164 again undergoes nano- or micro-structural modification in response to OID that results in a waviness or surface corrugation of magnetic regions. In FIG. 11, the waviness or surface corrugation is indicated by black stripes in the magnetic regions of MR sensor elements 146, 148, 156, 158, 162, 164. This waviness or surface corrugation is not observable in the orthogonal direction of FIG. 13. Magnetically, this surface corrugation results in the uniaxial magnetic anisotropy with a uniaxial easy axis along which a resultant magnetization 166 (denoted by a wide arrow) of each of MR sensor elements 146, 148, 156, 158, 162, 164 aligns. This resultant magnetization 166 is parallel to surface 150 of substrate 152, but perpendicular to an external magnetic field 168, $H_X$.

First half-bridge configuration 144 of first and second MR sensor elements 146, 148 may yield a first output signal 170, $V_{OUT(A)}$, at a first central node 172. Second half-bridge configuration 154 of third and fourth MR sensor elements 156, 158 may yield a second output signal 174, $V_{OUT(B)}$, at a second central node 176. Third half-bridge configuration 160 of fifth and sixth MR sensor elements 162, 164 may yield a third output signal 178, $V_{OUT(C)}$, at a third central node 180. In the gradient configuration of FIG. 13, a differential output signal may be the difference between first output signal 170 and third output signal 178 (OUT DIFF=$V_{OUT(A)}-V_{OUT(C)}$). Another differential output signal may be the difference between first output signal 170 and second output signal 174 and the difference between the second output signal 174 and third output signal 178 (OUT SUM=$2(V_{OUT(B)})-V_{OUT(A)}-V_{OUT(C)}$). Thus, MR sensor elements having their magnetic regions formed using an OID technique may be implemented in a gradient sensing configuration. Further, this gradient sensing configuration may advantageously be implemented in a rotational speed sensing application, such as in system 132 (FIG. 10), without the necessity of a permanent magnet structure (e.g., bias magnet) for generating a bias magnetic field.

Figure 14:
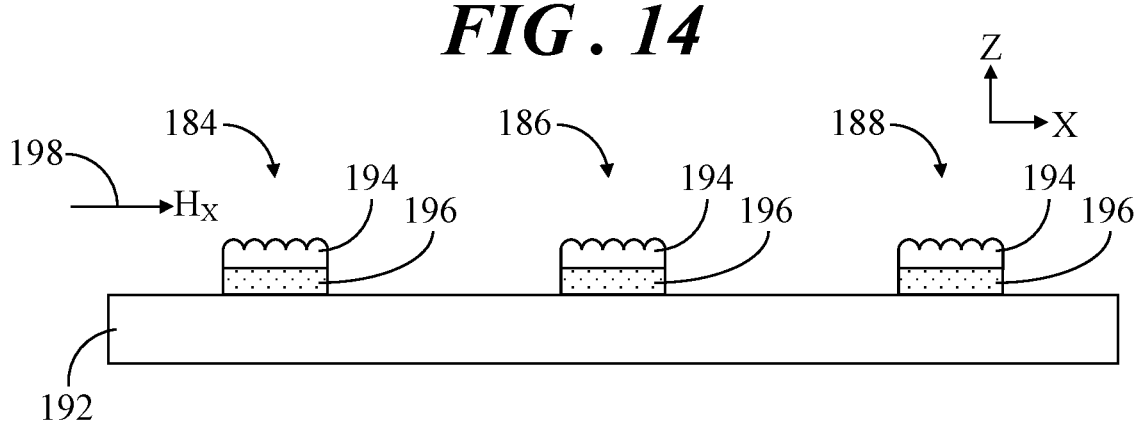
FIG. 14 shows a side view of a magnetic field sensor that includes multiple MR sensor elements in accordance with another embodiment.
Figure 15:
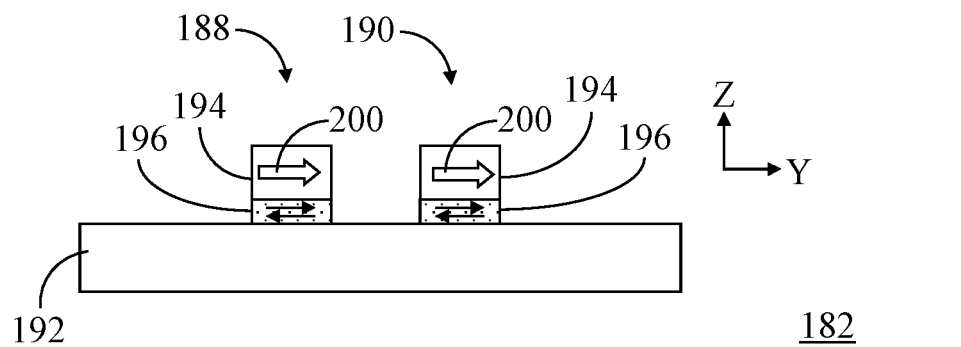
FIG. 15 shows another side view of the magnetic field sensor including MR sensor elements in accordance with the embodiment of FIG. 14.

Referring to FIGS. 14-15, FIG. 14 shows a side view of a magnetic field sensor 182 that includes multiple MR sensor elements 184, 186, 188 in accordance with another embodiment and FIG. 15 shows another side view of magnetic field sensor 182 that includes MR sensor elements 188, 190 in accordance with the embodiment of FIG. 14. In an example, MR sensor elements 184, 186, 188, 190 (along with two additional MR sensor elements, not visible in FIGS. 14-15) are formed on a substrate 192 and may be arranged in the multiple half-bridge configurations shown in FIG. 11. Thus, MR sensor elements 184, 186, 188 of FIG. 14 represent the side view along section lines 12-12 of FIG. 11 and MR sensor elements 188, 190 represent the side view along section lines 13-13 of FIG. 11.

MR sensor elements 184, 186, 188, 190 (along with two additional MR sensor elements, not visible in FIGS. 14-15) include magnetic regions 194 formed using OID to yield the waviness or surface corrugations visible in FIG. 14 and discussed extensively above. In some embodiments, an antiferromagnetic layer 196 may be formed below corresponding ones of magnetic regions 194. In other embodiments, antiferromagnetic layer 196 may be formed above the corresponding ones of magnetic regions 194. In addition to the biasing field, e.g., resultant magnetization created along the easy axis, antiferromagnetic layer 196 may further extend the measurement range for detection of an external magnetic field 198, $H_X$, parallel to the X-direction and reduce the impact of coercivity field 84 ($\pm H_{C(e.a.)}$), FIG. 6. The behavior of antiferromagnetic layer 196 is indicated by the two opposing arrows in FIG. 15 and an aligned resultant magnetization 200 parallel to the Y-direction is depicted by the wide arrows in FIG. 15.

Figure 16:
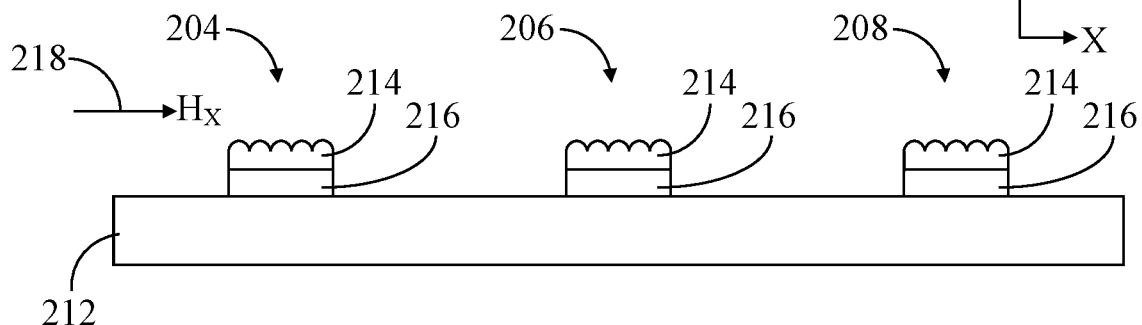
FIG. 16 shows a side view of a magnetic field sensor that includes multiple MR sensor elements in accordance with another embodiment.
Figure 17:
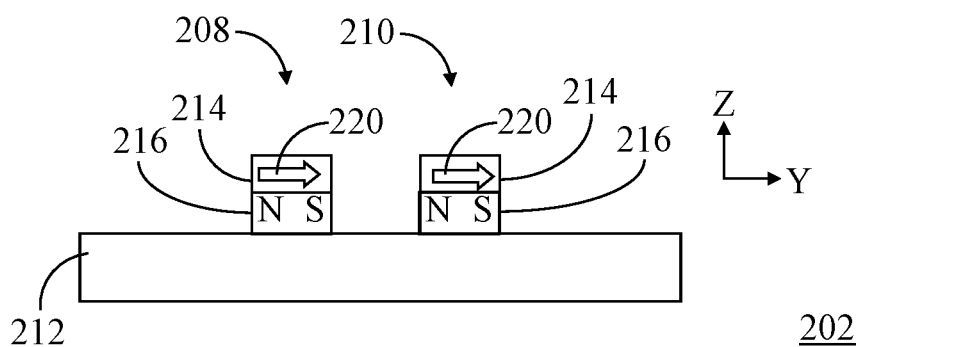
FIG. 17 shows another side view of the magnetic field sensor including MR sensor elements in accordance with the embodiment of FIG. 16.

Referring to FIGS. 16-17, FIG. 16 shows a side view of a magnetic field sensor 202 that includes multiple MR sensor elements 204, 206, 208 in accordance with another embodiment and FIG. 17 shows another side view of magnetic field sensor 202 that includes MR sensor elements 208, 210 in accordance with the embodiment of FIG. 16. In an example, MR sensor elements 204, 206, 208, 210 (along with two additional MR sensor elements, not visible in FIGS. 16-17) are formed on a substrate 212 and may be arranged in the multiple half-bridge configurations shown in FIG. 11. Thus, MR sensor elements 204, 206, 208 of FIG. 16 represent the side view along section lines 12-12 of FIG. 11 and MR sensor elements 208, 210 represent the side view along section lines 13-13 of FIG. 11.

MR sensor elements 204, 206, 208, 210 (along with two additional MR sensor elements, not visible in FIGS. 16-17) include magnetic regions 214 formed using OID to yield the waviness or surface corrugations visible in FIG. 16 and discussed extensively above. In some embodiments, a hard magnetic layer 216 may be formed below corresponding ones of magnetic regions 214. In other embodiments, hard magnetic layer 216 may be formed above the corresponding ones of magnetic regions 214. In addition to the biasing field, e.g., resultant magnetization created along the easy axis, hard magnetic layer 216 may further extend the measurement range for detection of an external magnetic field 218, $H_X$, parallel to the X-direction and reduce the impact of coercivity field 84 ($\pm H_{C(e.a.)}$), FIG. 6. The magnetic orientation of hard magnetic layer 216 is given by the north (N)

and south (S) pole and an aligned resultant magnetization 220 parallel to the Y-direction is depicted by the wide arrows in FIG. 17.

Figure 18:
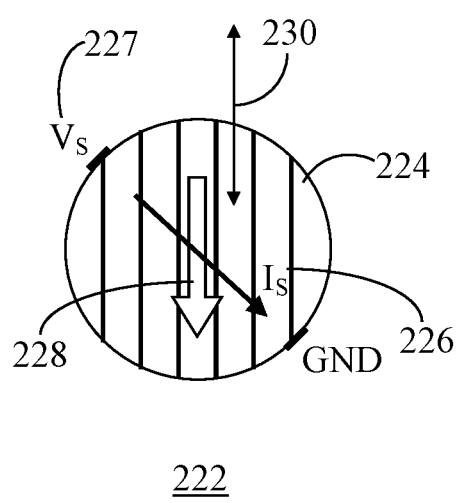
FIG. 18 shows a top view of an MR sensor element having a circular geometry.

FIG. 18 shows a top view of an MR sensor element 222 having a circular geometry. MR sensor element 222 includes a magnetic region 224 formed by OID, the waviness or surface corrugation being indicated by black stripes in magnetic region 224. MR sensor element 222 may be utilized as, for example, first and second MR sensor elements 102, 104 in half-bridge configuration 118 of FIG. 8. A supply current 226, $I_S$, is injected at a voltage terminal 227, $V_S$, and flows 45° relative to a resultant magnetization 228 aligned along an easy axis 230 of MR sensor element 222. MR sensor element 222 has a symmetric shape (e.g., circular) parallel to the surface of the magnetic field sensor (e.g., parallel to surface 106 of substrate 108 of magnetic field sensor 100, FIG. 8). Due to the symmetric shape of MR sensor element 222, no shape anisotropy exists. Thus, only the OID creates an anisotropy field, $H_K$ and easy axis 230 to yield resultant magnetization 228 (assuming other magnetic energy terms can be neglected).

Figure 19:
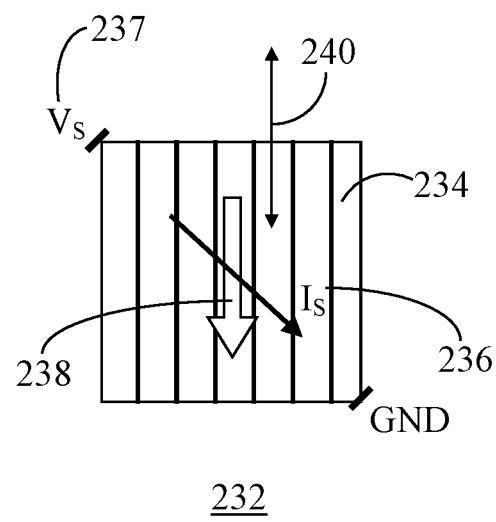
FIG. 19 shows a top view of an MR sensor element having a quadratic geometry.

FIG. 19 shows a top view of an MR sensor element 232 having a quadratic geometry. MR sensor element 232 includes a magnetic region 234 formed by OID, the waviness or surface corrugation being indicated by black stripes in magnetic region 234. MR sensor element 232 may be utilized as, for example, first and second MR sensor elements 102, 104 in half-bridge configuration 118 of FIG. 8. A supply current 236, $I_S$, is injected at a voltage terminal 237, $V_S$, and flows 45° relative to a resultant magnetization 238 aligned along an easy axis 240 of MR sensor element 232. MR sensor element 232 has a symmetric shape (e.g., square) parallel to the surface of the magnetic field sensor (e.g., parallel to surface 106 of substrate 108 of magnetic field sensor 100, FIG. 8). Due to the symmetric shape of MR sensor element 232, shape anisotropy can be neglected. Thus, only the OID creates an anisotropy field, $H_K$ and easy axis 240 to yield resultant magnetization 238 (assuming other magnetic energy terms can be neglected).

Figure 20:
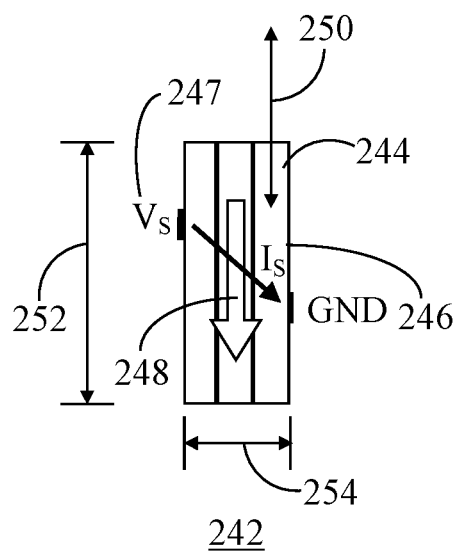
FIG. 20 shows a top view of an MR sensor element having a rectangular geometry with an asymmetric length to width relationship.

FIG. 20 shows a top view of an MR sensor element 242 having a rectangular geometry with an asymmetric length to width relationship. MR sensor element 242 includes a magnetic region 244 formed by OID, the waviness or surface corrugation being indicated by black stripes in magnetic region 244. MR sensor element 242 may be utilized as, for example, first and second MR sensor elements 102, 104 in half-bridge configuration 118 of FIG. 8. A supply current 246, $I_S$, is injected at a voltage terminal 24, $V_S$, and flows 45° relative to a resultant magnetization 248 aligned along an easy axis 250 of MR sensor element 242. In this example, MR sensor element 242 has a length 252 and a width 254 parallel to the surface of the magnetic field sensor (e.g., parallel to surface 106 of substrate 108 of magnetic field sensor 100, FIG. 8), with length 252 being greater than width 254. Due to the asymmetric length to width relationship, an additional anisotropy term by shape anisotropy contributes to the anisotropy field, $H_K$. The anisotropy due to OID and the shape anisotropy act in the same direction (e.g., along the long axis parallel to length 252) of MR sensor element 242. This configuration may enable additional stabilization of resultant magnetization 248 in some embodiments.

Figure 21:
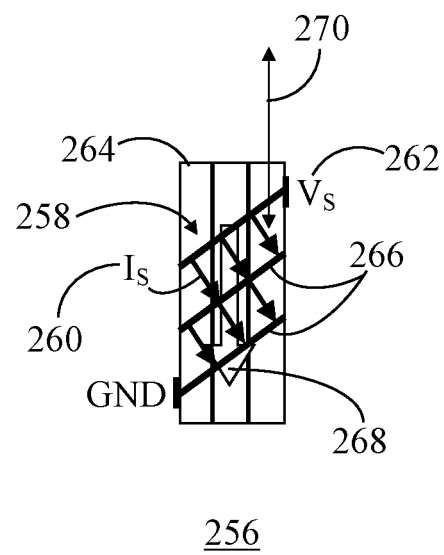
FIG. 21 shows a top view of an MR sensor element having a rectangular geometry with a barber pole structure for current injection.

FIG. 21 shows a top view of an MR sensor element 256 having a rectangular geometry with a barber pole structure 258 for injection of a supply current 260, $I_S$, injected at a voltage terminal 262, $V_S$. Again, MR sensor element 256 includes a magnetic region 264 formed by OID, the waviness or surface corrugation being indicated by black stripes in magnetic region 264. Further, MR sensor element 256 may be utilized as, for example, first and second MR sensor elements 102, 104 in half-bridge configuration 118 of FIG. 8. Like MR sensor element 242 (FIG. 20) MR sensor element 256 has the asymmetric length to width relationship so as to introduce a shape anisotropy contribution to the anisotropy field, $H_K$. Barber pole tracks 266, or stripes (three shown), of barber pole structure 258 define a direction of current flow through MR sensor element 256. Thus, the configuration of barber pole structure 258 causes supply current 260 to flow 45° relative to a resultant magnetization 268 aligned along an easy axis 270 of MR sensor element 256.

FIGS. 18-21 demonstrate various possible symmetric and asymmetric geometries of the magnetic regions of MR sensor elements with and without a barber pole structure in a non-limiting manner. Alternative embodiments may have differing geometric configurations then that shown to yield a desired shape anisotropy or no shape anisotropy. Further, the alternative embodiments may or may not include a barber pole structure to define a desired direction of current flow through the MR sensor element. Still further, the various geometric configurations of MR sensor elements with and without a barber pole structure may be implemented in a wide variety of half-bridge, full-bridge, and/or gradient configurations.

Figure 22:
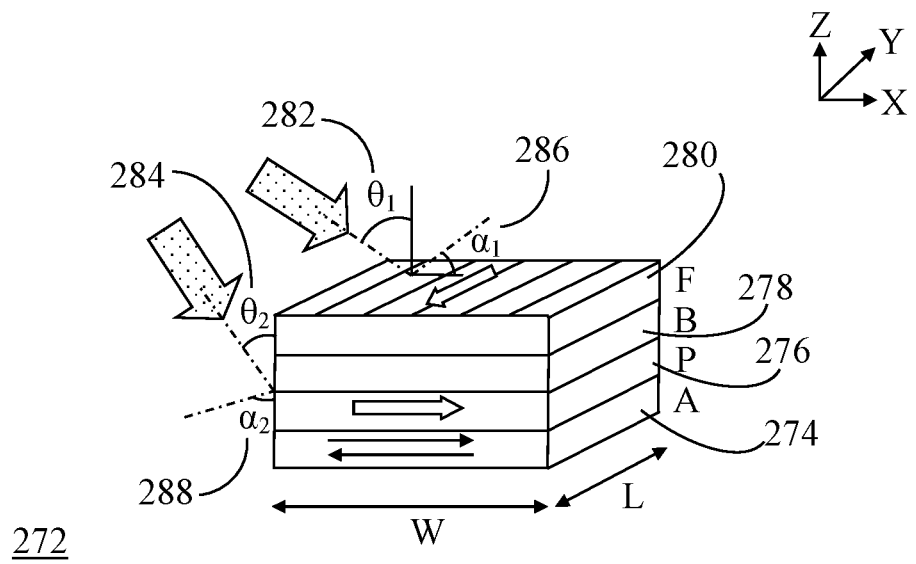
FIG. 22 shows a perspective view of an MR sensor stack with at least one layer deposited by oblique incident deposition.

FIG. 22 shows a perspective view of an MR sensor stack 272 with at least one layer deposited by oblique incident deposition (OID). The previously described MR sensor elements involved Anisotropic Magneto Resistance (AMR) technology. Alternatively, OID may be implemented to form magnetoresistive devices that implement Giant Magneto Resistance (GMR) technology and/or Tunnel Magneto Resistance (TMR) technology. Further, GMR stripes, GMR/TMR dots or arrays formed using OID may be utilized in the half-bridge and gradient configurations described above.

MR sensor stack 272 includes multiple layers of magnetic and non-magnetic materials. For example, a simplified MR sensor stack 272 includes at least one antiferromagnetic layer 274, A, a pinned magnetic layer 276, P, a barrier layer 278, B (conductive or non-conductive), and a free layer 280, F. In a conventional GMR/TMR sensor stack (not shown), linearization is achieved by an orthogonal configuration of the free layer magnetization and the pinned layer magnetization. This may be done, for example, by using the shape anisotropy effect, in which the magnetization of a layer aligns along the long axis of the layer shape (assuming other magnetic energy terms can be neglected). Thus, the free layer points along one axis (e.g., the Y-axis), and the pinned layer is aligned with an orthogonal axis (e.g., the X-axis) due to the antiferromagnetic coupling. The degree of tuning the anisotropy effect in such prior art structures is limited and comes with other constraints such as, shape variation limitations.

In accordance with some embodiments, instead of using the prior art technique of shape anisotropy for aligning the free and/or pinned magnetic layers, the OID technique is utilized. As such, at least one of pinned magnetic layer 276 and free layer 280 of MR sensor stack 272 is formed by OID to yield at least one of pinned magnetic layer 276 and free layer 280 having additional magnetic anisotropy due to OID. In the example, of FIG. 22, the magnetic characteristics of free magnetic layer 280 or pinned magnetic layer 276 can be adjusted over a wide range of deposition angles 282, 284 (e.g., $\theta_1$ and $\theta_2$) and azimuthal angles 286, 288 (e.g., $\alpha_1$ and $\alpha_2$). Accordingly, the length, L, and width, W, of MR sensor stack 272 need not vary significantly, but may instead be may approximately equal. Therefore, MR sensor elements specific to the application requirements may be fabricated while concurrently enabling design freedom (e.g., MR sensor element shape) and process freedom (e.g., temperature steps). Further, multiple layers (e.g., both pinned magnetic layer 276 and free layer 280) may be processed using the OID technique to further enhance the performance of a TMR or GMR sensor element.

Figure 23:
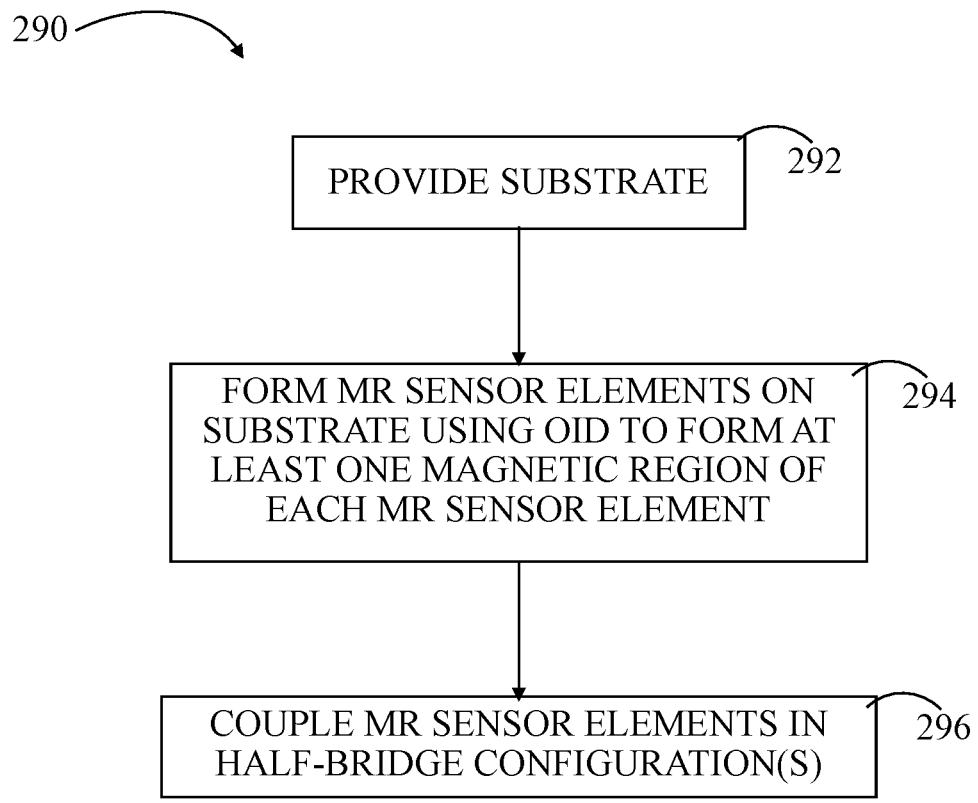
FIG. 23 shows a flowchart of a magnetic field sensor fabrication process in accordance with yet another embodiment.

FIG. 23 shows a flowchart of a magnetic field sensor fabrication process 290 in accordance with yet another embodiment. Magnetic field sensor fabrication process 290 may be executed to fabricate any of the magnetic field sensors having MR sensor elements as described above. At a block 292, a substrate is provided. The substrate may be an inert wafer material. Alternatively, the substrate may an application specific integrated circuit (ASIC). At a block 294, MR sensor elements are formed on the surface of the substrate using oblique incident deposition (OID) to form at least one magnetic region of each MR sensor element. As such, each of the MR sensor elements has a magnetic anisotropy with a resultant magnetization oriented in a first direction parallel to the surface of the substrate. At a block 296, the MR sensor elements are coupled in one or more half-bridge configurations, in which each half-bridge configuration is configured to provide an output signal that is responsive to an external magnetic field oriented in a second direction parallel to the surface of the magnetic field sensor and oriented perpendicular to the first direction of the resultant magnetization. In some embodiments, the forming the MR sensor elements includes arranging each of a first axis of a first MR sensor element and a second axis of the second MR sensor element parallel to the surface of the substrate and offset from each of the first and second directions, such that a supply current flows parallel to the first and second axes and thus offset from the direction of the resultant magnetization and the direction of the external magnetic field.

Thus, embodiments entail a magnetic field sensor, a system incorporating the magnetic field sensor, and methodology for fabricating the magnetic field sensor using an oblique incident deposition (OID) technique. More particularly, a magnetic field sensor includes magnetoresistive (MR) sensor elements, each having at least one magnetic region sputtered by oblique incident deposition. The OID technique yields a magnetic region having magnetic anisotropy and thus an easy axis. The resultant magnetization of the magnetic region aligns along the easy axis created by OID. The stable resultant magnetization of the MR sensor elements, created by the OID technique, may be implemented in lieu of utilizing a permanent magnet structure (e.g., a bias magnet) for providing a bias magnetic field to stabilize the magnetization of the magnetic regions of the MR sensor elements. Accordingly, a comparable magnetization configuration of the magnetic regions of the MR sensor elements may be achieved without the use of a permanent magnet structure (e.g., a bias magnet) for enhanced sensor performance and improvements in cost effectiveness. Multiples of the MR sensor elements may be coupled in one or more half-bridge configurations, which may be implemented in, for example, a rotational speed sensing system.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A magnetic field sensor comprising:
   a first magnetoresistive (MR) sensor element that includes a first magnetic region having a magnetic anisotropy and a resultant magnetization; and
   a second MR sensor element that includes a second magnetic region having the magnetic anisotropy with and the resultant magnetization; and
   wherein the first and second MR sensor elements are arranged in a half-bridge configuration;
   wherein the magnetic anisotropy is created by depositing each of the first and second magnetic regions at a nonzero deposition angle relative to a reference line oriented perpendicular to a surface of the magnetic field sensor; and
   wherein the resultant magnetizations of the first and second MR sensor elements are oriented in a preferred direction when no external magnetic field is applied to the magnetic field sensor, and the half-bridge configuration of first and second MR sensor elements is configured to provide an output signal that is responsive to an external magnetic field having a magnetic field component oriented in a second direction, the first and second directions being parallel to the surface of the magnetic field sensor and the first direction being perpendicular to the second direction.

2. The magnetic field sensor of claim 1 wherein the first and second MR sensor elements are arranged such that the resultant magnetization of the first MR sensor element is oriented in the same direction as the resultant magnetization of the second MR sensor element.

3. The magnetic field sensor of claim 1, wherein the first MR sensor element has a first axis; and wherein the second MR sensor element has a second axis, wherein the first and second axes are parallel to the surface of the magnetic field sensor, the first and second axes are offset from each of the first and second directions, and a supply current is configured to flow parallel to the first and second axes.

4. The magnetic field sensor of claim 3 wherein an angle between the first axis and the second axis is substantially 90 degrees, and an offset angle between each of the first axis and the second axis and each of the first and second directions is 45 degrees.

5. The magnetic field sensor of claim 1 further comprising a substrate, wherein the first and second MR sensor elements are formed on the substrate.

6. The magnetic field sensor of claim 1, wherein the half-bridge configuration is a first half-bridge configuration, and the magnetic field sensor further comprises two or more additional MR sensor elements, each of which includes a magnetic region having the magnetic anisotropy;

wherein pairs of the additional MR sensor elements are arranged in additional half-bridge configurations.

7. The magnetic field sensor of claim 1 wherein each of the first and second MR sensor elements further includes an antiferromagnetic layer located below or above a corresponding one of the first and second magnetic regions.

8. The magnetic field sensor of claim 1 wherein each of the first and second MR sensor elements further includes a hard magnetic layer located below or above a corresponding one of the first and second magnetic regions.

9. The magnetic field sensor of claim 1 wherein each of the first and second magnetic regions of the first and second MR sensor elements has a symmetric shape parallel to the surface of the magnetic field sensor.

10. The magnetic field sensor of claim 1 wherein each of the first and second magnetic regions of the first and second MR sensor elements has an asymmetric shape parallel to the surface of the magnetic field sensor.

11. The magnetic field sensor of claim 1 wherein each of the first and second MR sensor elements further includes a Barber pole structure.

12. The magnetic field sensor of claim 1 wherein each of the first and second MR sensor elements is a sensor stack that includes at least one antiferromagnetic layer, a pinned magnetic layer, a barrier layer, and a free layer, wherein for each of the first and second MR sensor elements, one of the pinned magnetic layer and the free layer has the magnetic anisotropy field with the resultant magnetization.

13. The magnetic field sensor of claim 1,
wherein the resultant magnetization of the first magnetic region is a remanent magnetization oriented along an easy magnetization axis of the first magnetic region determined by the magnetic anisotropy; and
wherein the remanent magnetization of the second magnetic region is oriented along an easy magnetization axis of the second magnetic region determined by the magnetic anisotropy.

14. The magnetic field sensor of claim 1,
wherein the first magnetic field sensor includes a first antiferromagnetic (AFM) element having a magnetization that is oriented parallel to the preferred direction at a surface of the first AFM element nearest to the first magnetic region, wherein the magnetization at the surface of the first AFM element nearest to the first magnetic region is configured to bias the resultant magnetization of the first magnetic region element along the preferred direction; and
wherein the second magnetic field sensor includes a second antiferromagnetic (AFM) element having a magnetization that is oriented parallel to the preferred direction at a surface of the second AFM element nearest to the second magnetic region, wherein the magnetization at the surface of the second AFM element nearest to the second magnetic region is configured to bias the resultant magnetization of the second magnetic region element along the preferred direction.

15. The magnetic field sensor of claim 1,
wherein the first magnetic field sensor includes a first hard magnetic layer having a magnetization that is oriented parallel to the preferred direction at a surface of the first hard magnetic layer nearest to the first magnetic region, wherein the magnetization at the surface of the first hard magnetic layer nearest to the first magnetic region is configured to bias the resultant magnetization of the first magnetic region element along the preferred direction; and wherein the second magnetic field sensor includes a second hard magnetic layer having a magnetization that is oriented parallel to the preferred direction at a surface of the second hard magnetic layer nearest to the second magnetic region, wherein the magnetization at the surface of the second hard magnetic layer nearest to the second magnetic region is configured to bias the resultant magnetization of the second magnetic region element along the preferred direction.

16. A method of fabricating a magnetic field sensor comprising:
providing a substrate with a surface;
forming a first magnetoresistive (MR) sensor element by depositing a first magnetic region having a magnetic anisotropy and a resultant magnetization on the surface of the substrate;
forming a second MR sensor element by depositing a second magnetic region having the magnetic anisotropy and the resultant magnetization on the surface of the substrate, wherein the magnetic anisotropy is created by depositing the magnetic region at a nonzero deposition angle relative to a reference line oriented perpendicular to the surface of the substrate and the magnetization of each of the first and second MR sensor elements is oriented in a first direction parallel to the surface of the substrate; and
coupling the first and second MR sensor elements in a half-bridge configuration, the half-bridge configuration being configured to provide an output signal that is responsive to an external magnetic field having a magnetic field component oriented in a second direction parallel to the surface of the magnetic field sensor and oriented perpendicular to the first direction and the resultant magnetization.

17. The method of claim 16 wherein:
the forming the first MR sensor element further includes arranging a first axis of the first MR sensor element parallel to the surface of the substrate and offset from each of the first and second directions; and
the forming the second MR sensor element further includes arranging a second axis of the second MR sensor element parallel to the surface of the substrate and offset from each of the first and second directions, wherein a supply current is configured to flow parallel to the first and second axes.

18. The method of claim 16 wherein the half-bridge configuration is a first half-bridge configuration and the method further comprises:
forming two or more additional MR sensor elements, each of which includes a magnetic region having the magnetic anisotropy, wherein the magnetic anisotropy of each of the additional MR sensor elements is created by depositing the magnetic region at the nonzero deposition angle; and
coupling pairs of the additional MR sensor elements to form additional half-bridge configurations of the magnetic field sensor.

19. The method of claim 16,
wherein the resultant magnetization of the first sensor element is a remanent magnetization oriented along an easy magnetization axis of the first magnetic region determined by the magnetic anisotropy; and
wherein the resultant magnetization of the second sensor element is a remanent magnetization oriented along an easy magnetization axis of the second magnetic region determined by the magnetic anisotropy.

20. A system comprising:
an encoder configured to produce an external magnetic field having predetermined magnetic variations in response to motion of the encoder; and
a magnetic field sensor configured to detect the external magnetic field comprising:
- a first magnetoresistive (MR) sensor element that includes a first magnetic region having a magnetic anisotropy and a resultant magnetization; and
- a second MR sensor element that includes a second magnetic region having the magnetic anisotropy and the resultant magnetization, the first and second MR sensor elements being arranged in a half-bridge configuration, wherein the magnetic anisotropy is created by depositing each of the first and second magnetic regions at a nonzero deposition angle relative to a reference line oriented perpendicular to a surface of the magnetic field sensor;

wherein the resultant magnetization of the first and second MR sensor elements is oriented in a first direction;
wherein the half-bridge configuration of first and second MR sensor elements is configured to provide an output signal that is responsive to the external magnetic field, the external magnetic field being oriented in a second direction, the first and second directions being parallel to the surface of the magnetic field sensor and the first direction being perpendicular to the second direction;
wherein the first MR sensor element has a first axis; and
wherein the second MR sensor element has a second axis, wherein the first and second axes are parallel to the surface of the magnetic field sensor, the first and second axes are offset from each of the first and second directions, and a supply current is configured to flow parallel to the first and second axes.

21. The system of claim 20,
wherein the resultant magnetization of the first magnetic region is a remanent magnetization oriented along an easy magnetization axis of the first magnetic region determined by the magnetic anisotropy; and
wherein the resultant magnetization of the second magnetic region is a remanent magnetization oriented along an easy magnetization axis of the second magnetic region determined by the magnetic anisotropy.

22. A system comprising:
an encoder configured to produce an external magnetic field having predetermined magnetic variations in response to motion of the encoder; and
a magnetic field sensor configured to detect the external magnetic field comprising:
- a first magnetoresistive (MR) sensor element that includes a first magnetic region having a magnetic anisotropy and a resultant magnetization; and
- a second MR sensor element that includes a second magnetic region having the magnetic anisotropy and the resultant magnetization, the first and second MR sensor elements being arranged in a half-bridge configuration;

wherein the resultant magnetization of the first and second MR sensor elements is oriented in a first direction;
wherein the half-bridge configuration of first and second MR sensor elements is configured to provide an output signal that is responsive to the external magnetic field, the external magnetic field being oriented in a second direction, the first and second directions being parallel to the surface of the magnetic field sensor and the first direction being perpendicular to the second direction;
wherein the first MR sensor element has a first axis; and
wherein the second MR sensor element has a second axis, wherein the first and second axes are parallel to the surface of the magnetic field sensor, the first and second axes are offset from each of the first and second directions, and a supply current is configured to flow parallel to the first and second axes.

* * * * *